United States Patent [19]

Rogers

[11] Patent Number: 4,673,894
[45] Date of Patent: Jun. 16, 1987

[54] OSCILLATOR COUPLED THROUGH CYLINDRICAL CAVITY FOR GENERATING LOW NOISE MICROWAVES

[75] Inventor: Robert G. Rogers, Los Altos, Calif.

[73] Assignee: California Microwave, Incorporated, Sunnyvale, Calif.

[21] Appl. No.: 850,162

[22] Filed: Apr. 10, 1986

[51] Int. Cl.$^4$ ............................ H03B 5/18; H01P 7/06
[52] U.S. Cl. ................................ 331/96; 331/107 DP; 331/117 D; 333/228; 333/230; 333/233
[58] Field of Search .............. 331/96, 107 DP, 117 D; 333/227, 228, 230, 231, 232, 233

[56] References Cited

FOREIGN PATENT DOCUMENTS 0117257 9/1984 European Pat. Off. ..... 331/107 DP
2756944 6/1979 Fed. Rep. of Germany ...... 331/107 DP

OTHER PUBLICATIONS

Nagano et al, "Highly Stabilized Half-Watt IMPATT Oscillator", IEEE Transactions on Microwave Theory and Techniques, vol. MTT-18, No. 11, Nov. 1970, pp. 885–890.
van der Heyden, "Design of Stable, Very Low Noise, Cavity Stabilized IMPATT Oscillators for C Band", IEEE Trans. Microwave Theory and Techniques, vol. MTT-25, Apr. 1977, pp. 318–323.

Primary Examiner—Siegfried H. Grimm
Attorney, Agent, or Firm—D. Gilbert

[57] ABSTRACT

A microwave oscillator having very low phase noise characteristics has a reflection oscillator circuit coupled to a right-circular cylindrical resonant cavity designed to operate in the $TE_{011}$ mode. The resonator length L and inner diameter D are restricted to a range of values such that $(D/L)^2$ is less than 2.5 but greater than 1.7. To suppress the $TM_{111}$ resonant modes in the resonator, two techniques are employed. A single tuning post is disposed on either resonator end plate at a point where the $TM_{111}$ electric field Z-component is a maximum. The post length is adjustably fixed to maximize the output microwave power at the cavity output port. Each end plate also has a continuous gap separating each plate from the housing to suppress electric field currents of the $TM_{111}$ mode flowing on the inner surface of the resonator.

13 Claims, 4 Drawing Figures

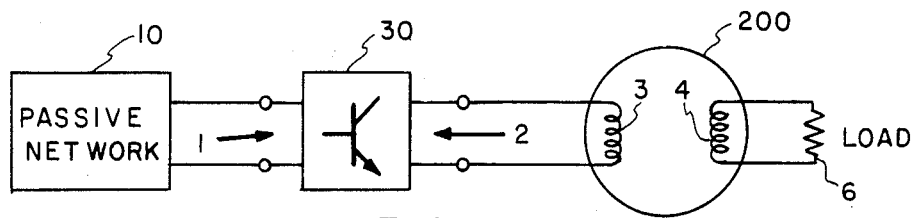
FIG. 1
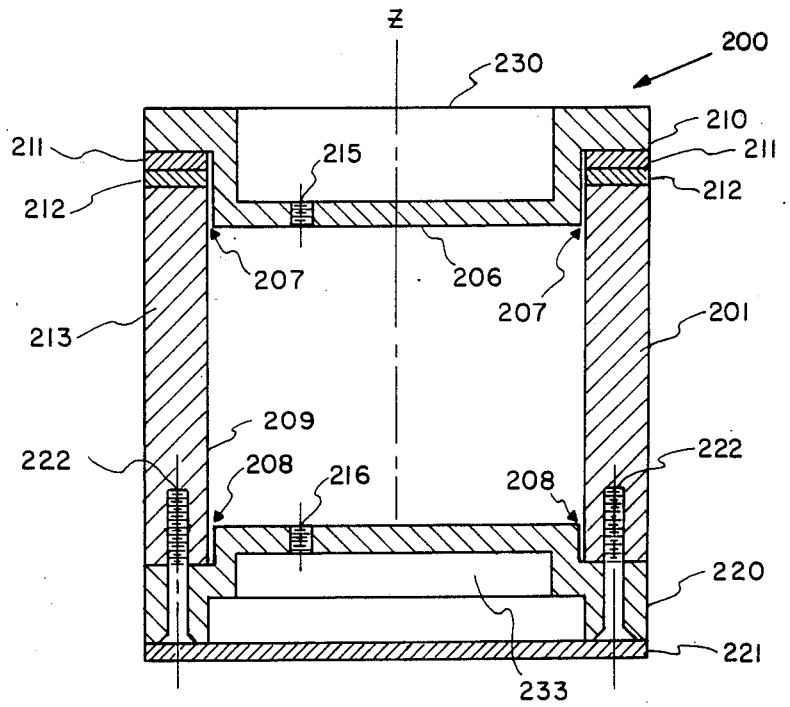
FIG. 2
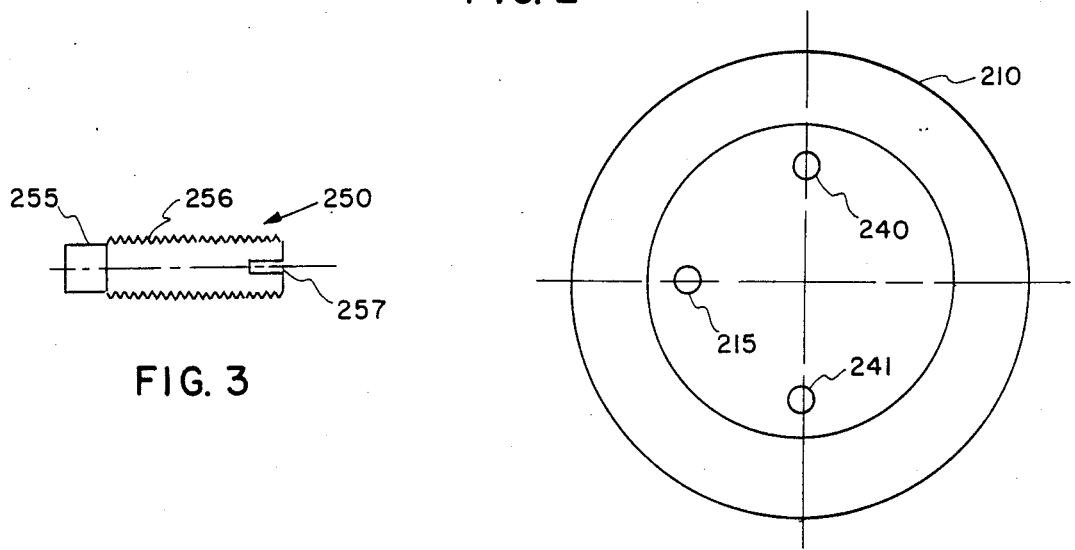
FIG. 3
FIG. 4

OSCILLATOR COUPLED THROUGH CYLINDRICAL CAVITY FOR GENERATING LOW NOISE MICROWAVES

BACKGROUND OF THE INVENTION

1. Field of the Invention

The present invention relates to microwave oscillators having very low phase noise and more particularly to an improved very low phase noise microwave oscillator having a reflection oscillator circuit operating in conjunction with a right-circular cylindrical waveguide cavity resonator.

2. Description of the Prior Art

Microwave oscillators with very low 1/f phase noise have numerous applications in microwave communication systems, radar systems, and elsewhere. Numerous attempts have been made to develop ultra low noise oscillators using a variety of different techniques and designs. The most recent attempts and the results achieved are reported in "GaAs: Key to Defense Electronics," by Edward Niehenke in the Microwave Journal, September 1985 issue at page 40. The very best FET designs have achieved phase noise figures between $-95$ and $-105$ dBc/Hz measured at 10 kHz from the main oscillator frequency which was in the 4 to 10 GHz frequency band.

Generally an oscillator with the lowest possible phase noise requires a resonator with the highest possible Q. Microwave cavity resonators have been known and used since the mid 1930's as resonant circuits for oscillators and filters because of their remarkably high Q and very high shunt impedance characteristics. The waveguide mode cavity resonator and particularly a right-circular cylindrical resonator is well suited to a low noise requirement since it has a large volume-to-surface area ratio (and thus has the potential for a high Q). Carefully designed silver or gold-plated right-circular cylindrical cavity resonators typically exhibit unloaded Q's well over 10000 in approximately the 6 to 8 GHz region, which is ideal for low noise oscillator circuits.

The subject invention is directed toward an improved low noise microwave oscillator design which exceeds the noise performance characteristics of existing oscillators.

Another object of the present invention is to provide an improved microwave cavity resonator which incorporates techniques for eliminating mode degeneracy which do not degrade the Q of the cavity.

SUMMARY OF THE INVENTION

In accordance with the teachings of the present invention, an active microwave reflection oscillator circuit is coupled to a right-circular cylindrical resonant cavity. The oscillator circuit has positive internal feedback sufficient to generate oscillations at microwave frequencies, and the physical parameters of the right-circular cylindrical resonant cavity are established so that the cylindrical $TE_{011}$ mode is the fundamental mode. More specifically, the length L and inner diameter D are selected so that $(D/L)^2$ is greater than 1.7 and less than 2.5, with 1.92 being the preferred ratio. In addition two different techniques are employed to suppress the $TM_{111}$ resonant modes of oscillation without affecting the Q of the cavity. The first consists of a conductive tuning post connected to one of the resonant cavity end plates and extending into the cavity a short distance. The post is disposed at one of two points on either end plate to detune the unwanted $TM_{111}$ modes. The second mode suppression technique consists of a continuous circular gap less than 0.10 D across separating a portion of the interior cavity surface of each plate from the cylindrical housing. This restricts microwave signal current flowing from the inner surface of the cavity housing to the end plates.

BRIEF DESCRIPTION OF THE DRAWINGS

For a better understanding of the invention as well as other objects and further features thereof, reference is made to the following description which is to be read in conjunction with the accompanying drawings wherein:

FIG. 1 is a block diagram illustrating the major components of the oscillator and their interconnection;

FIG. 2 is a cross-sectional view of the right-circular cylindrical waveguide cavity resonator according to one embodiment of the invention;

FIG. 3 is an illustration of one embodiment of the tuning post used in conjunction with the resonator to detune the $TM_{111}$ mode degeneracy; and FIG. 4 is an illustration of the bottom view of the top end plate for use in detuning the $TM_{111}$ mode degeneracy.

DETAILED DESCRIPTION OF THE INVENTION

Referring now to the drawings, FIG. 1 illustrates a passive network 10 connected to an active transistor circuit 30 which in turn is connected to a microwave cavity resonator 200. The passive network 10 is designed so that when the two elements 10 and 30 are connected at port 1 as shown as in FIG. 1, the impedance of the transistor looking back into port 2 from the resonator 200 contains a negative resistance. Such a design configuration causes transistor circuit 30 to oscillate at a microwave frequency f determined by the resonant cavity 200. The input port 3 couples energy from the oscillator circuit (10 and 30) into the cavity and, output port 4 couples a portion of the microwave energy out of the cavity to a load circuit 6.

Referring now to FIG. 2, cavity 200 is shown in a cross-sectional view to illustrate its various components. In one embodiment cavity 200 is formed from a block of an aluminum alloy (6061) over which a standard layered plating of copper, silver and gold is applied. For greater temperature stability invar could have been used instead of the aluminum alloy. The basic housing 201 is a right-circular cylinder open at both ends. Two circular end plates 210 and 220 (made of the same plated material) confine the resonant chamber and define the cavity length L (in the Z-axis). There are numerous ways in which the end plates could be secured to the housing, such as with the tapped bores 222 with mating screws. The recesses 230 and 233 in the end plates are used for the output circuit and the microstrip line oscillator circuit (10 and 30), respectively. The resonator output port 215 and input port 216 are shown in FIG. 2 without the standard coupling loops that would couple the microwave signal in and out of the cavity. In practice the coupling loops are typically one-quarter wavelength loops arranged perpendicular to the end plates and directed to couple energy toward or from the central Z-axis of the cavity. Aluminum rings or shims 211 and 212 are illustrative of the technique employed in the preferred embodiment for fine adjustment of the cavity length L and thus fine tunes the frequency. For a higher frequency the rings are removed to shorten the length. (In one specific application, L was 2.455 inches in length.)

In considering the optimum field distribution within the cavity $TE_{011}$ was selected for a number of design reasons. $TE_{011}$ has no circular field variations, no surface currents flowing between the cavity side walls and the end plates, and it has the maximum Q-to-volume ratio. With the desired mode selected it is possible to optimize the cavity dimensions. The physical parameters of the cavity, namely the inner diameter D and length L, should be carefully chosen so that $(D/L)^2$ is within the range of 1.7 to 2.5 with 1.92 being the preferred (diameter-to-length)$^2$ ratio. This is done to avoid other nearby frequency modes even though Q is actually optimum for $(D/L)^2 = 1$. Decreasing $(D/L)^2$ much less than 1.7 does increase the Q; however, the increase is offset by the proximity to and problem of eliminating the degenerate $TE_{112}$ mode. And, increasing $(D/L)^2$ substantially greater than 1.92 does not dramatically increase the mode problem, but it does drop Q unnecessarily. The length parameter L is a function of resonant frequency so that by selecting a particular frequency of operation, L can be easily determined which indirectly determines D given the $(D/L)^2$ restraints given above.

There are two other features of the cavity that should be noted. Both end plates 210 and 220 have a continuous gap or separation 207 and 208 separating a portion (approximately 0.25 inches in depth in one embodiment) of the end plate surface from the inner surface of the housing walls 209. To illustrate the amount of gap needed, in one embodiment the inner diameter of plate 210 was 0.02" less than the inner diameter D of the cavity housing 201. The purpose of the continuous gap is to prevent currents from flowing from the inner surface of the housing wall to the end plates. Since the degenerate mode $TM_{111}$ exhibits these wall currents, the effect of the gap is to suppress the undesired modes without negatively affecting the Q of the cavity. Other modes having these wall currents are also suppressed.

The other feature of the cavity that should be noted is illustrated in FIG. 3. A tuning post (also called a tuning plug) can be used advantageously to suppress the $TM_{111}$ frequency mode. FIG. 3 illustrates one embodiment of such a post 250. A portion of the post 256 is threaded so that the post can be precisely inserted to the desired depth into the cavity. The portion of the post that actually detunes the degenerate mode is section 255. Slot 257 is provided as a convenience in screwing the post into the cavity. The optimum location of the post is illustrated in FIG. 4.

FIG. 4 is a bottom view of the top end plate 210 illustrating the input port 215 and the threaded bores 240 and 241. Given the location of port 215 as shown, the post should be disposed on the end plate where the $TM_{111}$ E field is at a maximum, namely at 240 and 241. In practice either location (but not both) should be used to detune the undesired mode by monitoring the power out and tuning (inserting the post) for a peak. Although a circle of posts has been used in the prior art for a similar purpose, the result of multiple posts is a lowering of the Q. (Dielectric coatings on the end plate have also been used to detune the other modes but the Q is also adversely affected).

While the invention has been described with reference to its preferred embodiments, it will be understood by those skilled in the art that various changes may be made and equivalents may be substituted for elements thereof without departing from the true spirit and scope of the invention. In addition, many modifications may be made to adapt a particular situation or material to the teaching of the invention without departing from its essential teachings.

What is claimed is:

1. A low noise microwave oscillator comprising:
   an active microwave oscillator circuit having positive internal feedback sufficient to generate oscillations at microwave frequencies; and
   a right-circular cylindrical resonant cavity for resonating in a cylindrical $TE_{011}$ mode, said resonant cavity comprising:
      a right-circular cylindrical housing defining said cavity, said housing having a longitudinal Z-axis, and a length L and an inner diameter D where $(D/L)^2$ is greater than 1.7 and less than 2.5;
      two circular end plates, one enclosing each end of said housing;
      an input port at one of said end plates for coupling said microwave oscillations from said oscillator circuit to said cavity;
      suppression means for suppressing $TM_{111}$ resonant modes of oscillation comprising:
         a post connected to one of said end plates and extending therefrom into said cavity, and disposed at a point on said plate where the $TM_{111}$ mode electric field Z-component into the cavity interior would be at a maximum, said post having a length much less than L and a diameter equal to or less than its length; and
         said end plates each having a continuous circular gap less than 0.10 D across separating a portion of the interior cavity surface of each plate from said cylindrical housing to restrict microwave signal current flow from the inner surface of said housing to said end plates.

2. A low noise microwave oscillator as in claim 1 further comprising:
   an output port located at the end plate opposite said input port for coupling microwave signals from the resonant cavity to a load connected to said output port.

3. A low noise microwave oscillator as in claim 2 wherein said active microwave oscillator circuit further comprises a reflection oscillator circuit.

4. A low noise microwave oscillator as in claim 3 wherein said $(D/L)^2$ is approximately 1.92.

5. A low noise microwave oscillator as in claim 3 wherein said post length is adjusted so that the Q of the oscillator circuit and resonant cavity combination is at a relative maximum.

6. A low noise microwave oscillator as in claim 3 wherein said post length is established so that the microwave output available power at said output port is a maximum.

7. A low noise microwave oscillator as in claim 4 wherein said post is disposed on the end plate containing said input port.

8. A low noise microwave oscillator as in claim 3 wherein said housing and end plates are made of an aluminum alloy having plated thereon a thin coating of copper, silver and gold.

9. A low noise microwave oscillator as in claim 4 wherein said active microwave oscillator circuit is a negative resistance source at the frequency of oscillation of sufficient amplitude to just overcome the electrical loss in said cavity and any load impedance connected to said output port.

10. A low noise microwave oscillator as in claim 4 wherein said input port further comprises a coupling loop having a length of ¼ wavelength of the frequency of oscillation and positioned to face the Z-axis of the cavity.

11. A low noise microwave oscillator as in claim 4 wherein said circular gap separation is approximately 1% of D across.

12. A low noise microwave reflection oscillator having a rightcircular cylindrical waveguide cavity as the frequency determining element, said oscillator comprising:
   a high gain microwave oscillator circuit having an output and a negative resistance means for providing positive internal feedback sufficient to cause oscillations at microwave frequencies;
   a right circular cylindrical resonant cavity for resonating with a cylindrical $TE_{011}$ mode, said resonant cavity having two end plate portions, a cylindrical body portion of length L and diameter D where $(D/L)^2$ is greater than 1.7 and less than 2.5, and comprising:
   input coupling means located at one of said end plates for coupling a microwave signal from said oscillator circuit output to said cavity, said coupling means comprising a small circular wire loop disposed in a plane perpendicular to said end plates;
   output coupling means located at the other of said end plates for coupling a useful output microwave signal to a load connected thereto; and
   suppression means for suppressing within the cavity resonating modes of oscillation other than the $TE_{011}$ mode and comprising:
   a single post connected to one of said end plates and disposed at a point on said plate of maximum charge concentration, said post electrically shortening the length dimension L at the point of connection to said end plate; and
   a continuous circular gap less than 0.10 D across separating a portion of the interior cavity surface of each plate from said cylindrical housing to restrict microwave signal current flow from the inner surface of said housing to said end plates.

13. A right-circular cylindrical waveguide cavity for resonating with a cylindrical $TE_{011}$ mode when used as the frequency determining element in a low noise microwave oscillator, said cavity comprising:
   a right-circular cylindrical metallic housing of length L and diameter D where $(D/L)^2$ is approximately 1.92;
   two end plates enclosing said housing, each plate having a continuous circular gap approximately 0.01 D across separating a portion of the interior surface of each plate from said cylindrical housing to restrict microwave signal current flow from the inner surface of said housing to said end plates, said end plates and said housing defining a resonant cavity; and
   a single circular post connected to the interior surface of one of said end plates and extending therefrom into said cavity, and disposed at a point on said plate where the $TM_{111}$ mode electric field Z-component into the cavity interior would be at a maximum, said post having a length and diameter, said length being adjusted so that the Q of the cavity is a maximum at the desired resonant frequency and said diameter equal to or less than its length;
   said post and said circular gaps for suppressing within the cavity resonating modes of oscillation other than the $TE_{011}$ mode.

* * * * *